United States Patent
Li et al.

(10) Patent No.: US 10,409,134 B2
(45) Date of Patent: Sep. 10, 2019

(54) ELECTRONIC PAPER DISPLAY PANEL, DRIVING METHOD AND ELECTRONIC PAPER DISPLAY DEVICE

(71) Applicant: Shanghai Tianma Micro-Electronics Co., Ltd., Shanghai (CN)

(72) Inventors: Jinyu Li, Shanghai (CN); Kerui Xi, Shanghai (CN); Zuzhao Xu, Shanghai (CN); Wenqin Xu, Shanghai (CN); Lei Du, Shanghai (CN); Yian Zhou, Shanghai (CN)

(73) Assignee: SHANGHAI TIANMA MICRO-ELECTRONIC CO., LTD., Shanghai (CN)

( * ) Notice: Subject to any disclaimer, the term of this patent is extended or adjusted under 35 U.S.C. 154(b) by 0 days.

(21) Appl. No.: 15/782,438

(22) Filed: Oct. 12, 2017

(65) Prior Publication Data
US 2018/0329268 A1    Nov. 15, 2018

(30) Foreign Application Priority Data
May 10, 2017    (CN) .......................... 2017 1 0324819

(51) Int. Cl.
*G02F 1/167* (2019.01)
*H01L 27/146* (2006.01)
(Continued)

(52) U.S. Cl.
CPC ........ *G02F 1/167* (2013.01); *H01L 27/14607* (2013.01); *H01L 27/156* (2013.01); *G02F 1/1676* (2019.01)

(58) Field of Classification Search
CPC ............. G02F 1/167; G02F 2001/1672; G02F 2001/1674; G02F 2001/1676;
(Continued)

(56) References Cited

U.S. PATENT DOCUMENTS

| 2008/0079688 | A1* | 4/2008 | Yang | ...................... G09G 3/344 345/107 |
| 2011/0057870 | A1* | 3/2011 | Miyashita | ............... G02F 1/167 345/107 |

(Continued)

FOREIGN PATENT DOCUMENTS

| CN | 102012596 A | 4/2011 |
| CN | 102621762 A | 8/2012 |

OTHER PUBLICATIONS

Chinese Office Action dated Feb. 2, 2019 for corresponding CN Application No. 201710324819.7, with English translation.

*Primary Examiner* — Tom V Sheng
(74) *Attorney, Agent, or Firm* — Tarolli, Sundheim, Covell & Tummino LLP

(57) ABSTRACT

An electronic paper display panel, including a first and second substrate; an electrophoresis layer arranged between the first and second substrates, the electrophoresis layer including black electrophoretic particle, white electrophoretic particle and at least one color electrophoretic particle; a first electrode layer arranged at a side of the first substrate facing the second substrate including multiple first electrodes; a second electrode layer arranged at a side of the second substrate facing the first substrate including multiple second electrodes; and a drive circuit; multiple pixel areas correspond multiple second electrodes; each first electrode includes a first sub-electrode and a second sub-electrode placed in same pixel area, which are insulated from each other, correspond to one second electrode and are connected with drive circuit, the first sub-electrode receives voltage signal different from voltage signal the second sub-electrode receives; the first electrode is common electrode and the second electrode is pixel electrode.

20 Claims, 9 Drawing Sheets

(51) Int. Cl.
*H01L 27/15* (2006.01)
*G02F 1/1676* (2019.01)

(58) Field of Classification Search
CPC ........... G02F 2001/1678; G02F 1/1676; H01L 27/14607; H01L 27/156
See application file for complete search history.

(56) References Cited

U.S. PATENT DOCUMENTS

| | | | | |
|---|---|---|---|---|
| 2011/0057871 A1* | 3/2011 | Miyashita | ............... | G09G 3/344 345/107 |
| 2012/0194899 A1* | 8/2012 | Zhang | ..................... | G02F 1/167 359/296 |
| 2014/0092465 A1* | 4/2014 | Wang | ....................... | G02F 1/167 359/296 |
| 2014/0340735 A1* | 11/2014 | Lin | ......................... | G02F 1/167 359/296 |
| 2016/0011484 A1* | 1/2016 | Chan | ..................... | G09G 3/344 345/691 |
| 2016/0026062 A1* | 1/2016 | Zhang | ..................... | G02F 1/167 359/296 |
| 2016/0140909 A1* | 5/2016 | Lin | ......................... | G09G 3/344 345/690 |

* cited by examiner

ELECTRONIC PAPER DISPLAY PANEL, DRIVING METHOD AND ELECTRONIC PAPER DISPLAY DEVICE

CROSS-REFERENCE TO RELATED APPLICATIONS

The present application claims priority to Chinese Patent Application No. 201710324819.7, filed on May 10, 2017, the content of which is incorporated herein by reference in its entirety.

TECHNICAL FIELD

The present disclosure relates to the field of display technologies and, particularly, relates to an electronic paper display panel, a driving method and an electronic paper display device.

BACKGROUND

With the development of display technologies, an electronic paper technology gets more and more popular in application of e-book reading device due to its unique advantages. The electronic paper technology mainly uses an electrophoretic display technology, which has the following advantages: (i), energy consumption is low, and after the power supply is turned off, electrophoresis can still keep image on the displayer for several days or even several months; (ii), the electronic paper display belongs to a reflection-type display, so that it has good sunlight readability, and the sunlight can be combined with front or side light for display in dark environment; (iii), this technology has a potential of low production costs and does not require strict packaging, and use of solution processing technology such as printing is completely feasible; (iv), the electronic paper can be flexibly shaped, and it can be made on a plastic, metal or glass surface, so that it is a best option for the flexible display technology.

At present, the electronic paper display technology can only display black and white colors, and cannot display color image as the liquid crystal display and organic light-emitting display do. Movement of electrophoretic particles for electronic paper display under different voltages is very complicated, so that it is very difficult for now to make a breakthrough in the color electronic paper display technology.

SUMMARY

In order to achieve color display in the electronic paper display technology, the present disclosure provides an electronic paper display panel, including a first substrate; a second substrate opposite to the first substrate; an electrophoresis layer arranged between the first substrate and the second substrate; the electrophoresis layer including a black electrophoretic particle, a white electrophoretic particle and at least one color electrophoretic particle; a first electrode layer arranged at a side of the first substrate facing the second substrate, the first electrode layer including a plurality of first electrodes; a second electrode layer arranged at a side of the second substrate facing the first substrate, the second electrode layer including a plurality of second electrodes; and a drive circuit; wherein the electronic paper display panel has a plurality of pixel areas, and the plurality of pixel areas corresponds to the plurality of second electrodes; each first electrode includes a first sub-electrode and a second sub-electrode, the first sub-electrode and the second sub-electrode of a same first electrode are placed in a same pixel area, and the first sub-electrode is electrically insulated from the second sub-electrode; the first sub-electrode and the second sub-electrode of one first second electrode correspond to one second electrode; the first sub-electrode and the second sub-electrode are electrically connected with the drive circuit, the first sub-electrode receives a voltage signal different from a voltage signal the second sub-electrode receives; and the plurality of first electrodes is common electrodes and the plurality of second electrodes is pixel electrodes.

The present disclosure further provides a driving method, driving the above-described electronic paper display panel, the driving method includes a reset stage and a display stage; during the reset stage, the black electrophoretic particle, the white particle and the color electrophoretic particle are in a suspension state; during the display stage, a drive signal is input to the second electrode, a first signal is input to the first sub-electrode, and a second signal is input to the second sub-electrode.

The present disclosure further provides an electronic paper display device, including the above-described electronic paper display panel.

Compared with the prior art, the technical solutions of the present disclosure has at least one of the following advantages: The electronic paper display panel includes a first substrate and a second substrate. The first electrode layer is provided on the first substrate, and the first electrode layer includes a plurality of first electrodes; the second electrode layer is provided on the second substrate, and the second electrode layer includes a plurality of second electrodes. The first electrode is divided into the first sub-electrode and the second sub-electrode, the first electrode is the common electrode, and the second electrode is the pixel electrode. One second electrode corresponds to one first sub-electrode and one second sub-electrode. The first and second sub-electrodes corresponding to the same second electrode receive different common voltage signals, respectively. That is, in each pixel area, the common electrode is divided into at least two areas where different voltages are input, so that different electrophoretic particles within a same pixel area can be controlled, thereby achieving color display of different gray-scales.

BRIEF DESCRIPTION OF DRAWINGS

In order to more clearly illustrate technical solutions in embodiments of the present disclosure, the accompanying drawings used in the embodiments are briefly introduced as follows. Obviously, the drawings described as follows are merely part of the embodiments of the present disclosure, other drawings can also be acquired by those skilled in the art without paying creative efforts.

DESCRIPTION OF EMBODIMENTS

An electronic paper display panel and a driving method of the electronic paper display panel will be described in further detail as follows with reference to the accompanying drawings. It should be understood that, those skilled in the art may modify the present disclosure described herein while still achieving advantageous effects of the present disclosure. Therefore, the following description should be used for those skilled in the art to understand the present disclosure but is not intended to limit the present disclosure.

The terms used in the embodiments of the present disclosure are merely for the purpose of describing particular embodiments and not intended to limit the present disclosure. Unless otherwise noted in the context, the singular form expressions "a", "an", "the" and "said" used in the embodiments and appended claims of the present disclosure are also intended to represent a plural form.

The present disclosure provides an electronic paper display panel. The electronic paper display panel includes a first substrate and a second substrate disposed opposite to the first substrate, and further includes:

an electrophoresis layer placed between the first substrate and the second substrate; wherein the electrophoresis layer includes black electrophoretic particle, white electrophoretic particle and at least one color electrophoretic particle;

a first electrode layer placed at a side of the first substrate facing the second substrate, the first electrode layer including a plurality of first electrodes;

a second electrode layer placed at a side of the second substrate facing the first substrate, the second electrode layer including a plurality of second electrodes; and a drive circuit;

wherein the electronic paper display panel includes a plurality of pixel areas, and the plurality of second electrodes is correspondingly placed in the plurality of pixel areas; each first electrode includes a first sub-electrode and a second sub-electrode, and the first and second sub-electrodes of one first electrode are placed in a same pixel area and are electrically insulated from each other; the first sub-electrode and the second sub-electrode are opposite to the second electrode; and the first sub-electrode and the second sub-electrode are electrically connected with the drive circuit, and a voltage signal the first sub-electrode receives is different from a voltage signal the second sub-electrode receives.

The first electrode is a common electrode, and the second electrode is a pixel electrode.

Figure 1:
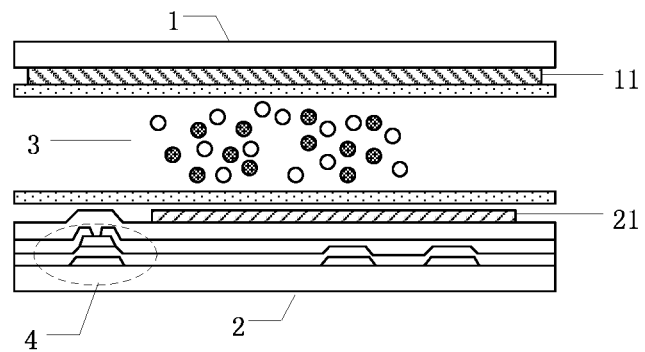
FIG. 1 illustrates a schematic diagram of an electronic paper display panel in the prior art.

FIG. 1 illustrates a schematic diagram of an electronic paper display panel in the prior art. As shown in FIG. 1, the electronic paper display panel currently popular in the market includes a first substrate 1 and a second substrate 2, a common electrode 11 is provided on the first substrate 1, and a pixel electrode 21 is provided on the second substrate 2. The common electrode 11 is opposite to the pixel electrode 21, that is, in one pixel area, an electrophoresis layer 3 is provided between a planar common electrode and a planar pixel electrode. The electrophoresis layer 3 is constituted mainly by black electrophoretic particle and white electrophoretic particle. The electronic paper display panel provides a corresponding drive voltage signal to the pixel electrode 21 via a transistor switch 4 on the second substrate 2. In addition, the electrophoretic particles refer to particles that can move under the action of an electric field. Optionally, the electrophoretic particles are mainly titanium dioxide particles, which are dispersed into hydrocarbon oil, meanwhile, black fuel, surfactant, and charge-control agent which charges the particles are also added into the hydrocarbon oil, and then this mixture is disposed between parallel conductive plates, for example, between the pixel electrode 21 and the common electrode 11 as shown in FIG. 1.

Figure 2:
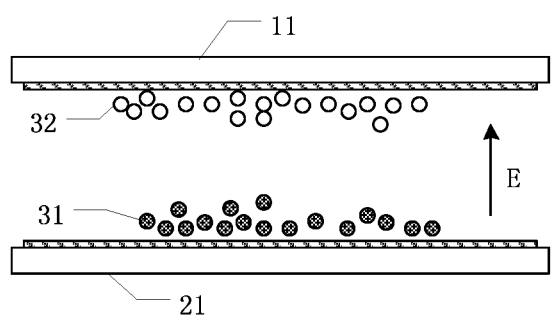
FIG. 2 illustrates a working principle diagram of an electronic paper display panel in the prior art.
Figure 3:
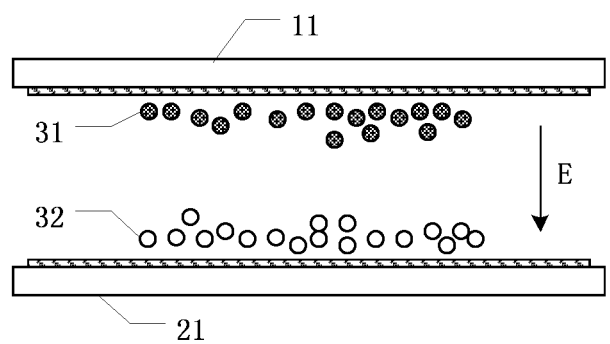
FIG. 3 illustrates a working principle diagram of an electronic paper display panel in the prior art.

The working principle of the electronic paper in the prior art is described in detail with reference to FIGS. 2-3, both of which illustrate a working principle diagram of an electronic paper display panel in the prior art. When a voltage is applied to the pixel electrode 21 and the common electrode 11, the black electrophoretic particle 31 and the white electrophoretic particle 32 in the electrophoresis layer will start to move from a suspension state as shown in FIG. 1. A suitable voltage can be applied to each area of the electronic paper to produce a reflection area and absorption area pattern, so as to form an image. The black electrophoretic particle 31 is negatively charged, while the white electrophoretic particle 32 are positively charged. When as shown in FIG. 2, a positive voltage is input to the pixel electrode 21, and a negative voltage is input to the common electrode 11, the black electrophoretic particle 31 move toward the pixel electrode 21, the white electrophoretic particle 32 move toward the common electrode 11, and a corresponding position displays white color. When as shown in FIG. 3, a negative voltage is input to the pixel electrode 21, and a positive voltage is input to the common electrode 11, the black electrophoretic particle 31 move toward the common electrode 11, the white electrophoretic particle 32 move toward the pixel electrode 21, and a corresponding position displays black color. Since the data signal displayed by the electronic paper has no gray-scale voltage but only has a two-state voltage which makes the electrophoretic particles move, it is difficult to achieve color display.

Figure 4:
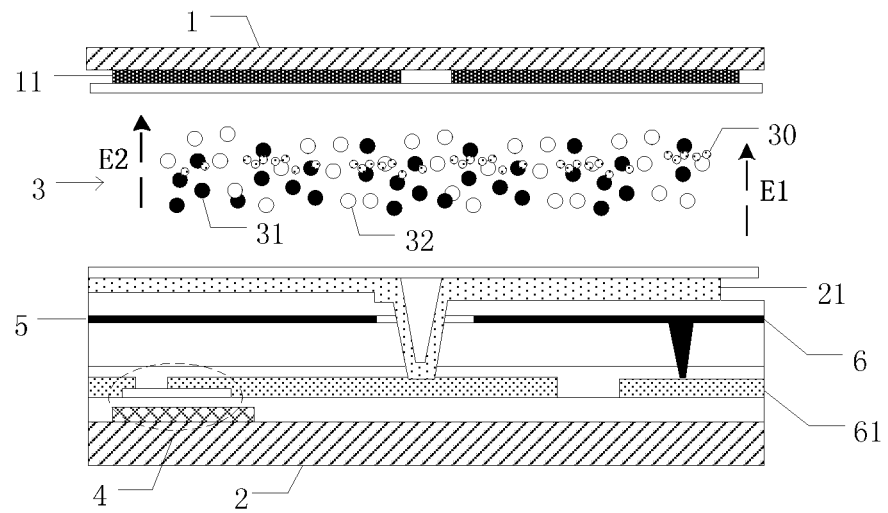
FIG. 4 illustrates a structural schematic diagram of an electronic paper display panel according to an embodiment of the present disclosure.

The present disclosure provides an electronic paper display panel, and FIG. 4 illustrates a structural schematic diagram of an electronic paper display panel according to an embodiment of the present disclosure. As shown in FIG. 4, the electronic paper display panel includes a first substrate 1, and a second substrate 2 opposite to the first substrate 1. The second substrate 2 can be an array substrate, for example a glass substrate or a flexible polyimide substrate. An electrophoresis layer 3 is provided between the first substrate 1 and the second substrate 2, wherein the electrophoresis layer 3 includes a black electrophoretic particle 31, a white electrophoretic particle 32 and at least one color electrophoretic particle 30.

The color electrophoretic particle 30 can be at least one of red electrophoretic particle, green electrophoretic particle and yellow electrophoretic particle. For example, the color electrophoretic particle 30 can be only the red electrophoretic particle, the green electrophoretic particle or the yellow electrophoretic particle, or be a combination of any two of the red electrophoretic particle, the green electrophoretic particle and the yellow electrophoretic particle, or be a combination of all three of the red electrophoretic particle, the green electrophoretic particle and the yellow electrophoretic particle, which will not be further limited herein.

Figure 12:
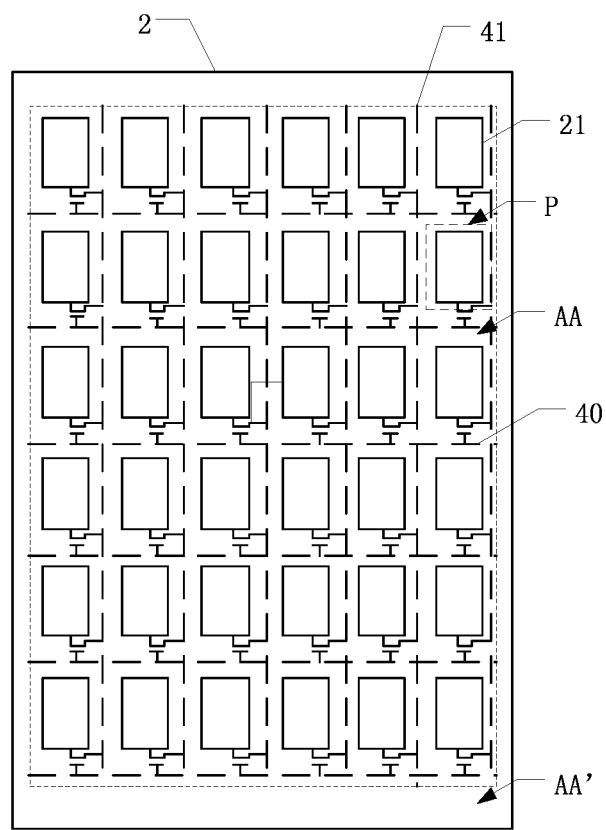
FIG. 12 illustrates a schematic diagram of a second electrode of an electronic paper display panel according to an embodiment of the present disclosure.

A first electrode layer is provided at aside of the first substrate 1 facing the second substrate 2, and the first electrode layer includes a plurality of first electrodes 11, the plurality of first electrodes 11 are common electrodes for receiving a common voltage signal; a second electrode layer is provided at the second substrate facing the first substrate 1, the second electrode layer includes a plurality of second electrodes 21. Optionally, the electronic paper display panel is divided into a plurality of pixel areas P (as shown in FIG. 12 but not shown in FIG. 4), and each pixel area P is correspondingly provided with one second electrode 21. Optionally, the first electrode 11 includes a first sub-electrode and a second sub-electrode, and the first sub-electrode and a second sub-electrode of a same first electrode 11 are placed in a same pixel area P.

Figure 5:
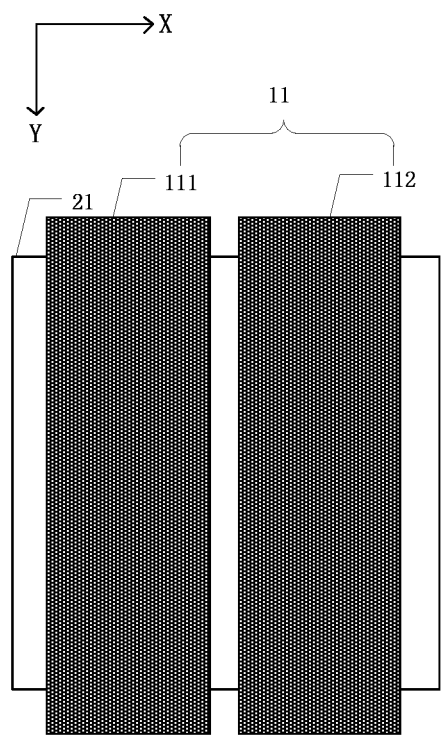
FIG. 5 illustrates a schematic diagram of a first electrode of an electronic paper display panel according to an embodiment of the present disclosure.

The configuration of the first electrode 11 is more clearly described with reference to FIGS. 4-5. FIG. 5 illustrates a schematic diagram of a first electrode of an electronic paper display panel according to an embodiment of the present disclosure. As shown in the figures, the first electrode 11 includes a first sub-electrode 111 and a second sub-electrode 112, and the first sub-electrode 111 is electrically insulated from the second sub-electrode 112. Besides, the first sub-electrode 111 and the second sub-electrode 112 correspond to the second electrode 21. That is, one second electrode 21 is opposite to one first electrode 11, wherein the first electrode includes one first sub-electrode 111 and one second sub-electrode 112. The first sub-electrode 111 and the second sub-electrode 112 are respectively electrically connected with a drive circuit (not shown in figures), and the first sub-electrode 111 receives a voltage signal that is different from a voltage signal the second sub-electrode 112 receives. For example, the first sub-electrode 111 receives a first signal, and cooperates with the second electrode 21 to form a first electric field E1; the second sub-electrode 112 receives a second signal, and cooperates with the second electrode 21 to form a second electric field E2. That is, in the present embodiment, at least two electric fields can be formed in one pixel area P, which can drive different electrophoretic particles to move, thereby achieving color display. The specific working principle of the color electrophoresis display will be described in a driving method, which will not be repeated herein. In addition, since the first electrode 11 is placed on the first substrate, electrode wirings on the first substrate 1 are relatively few, so that it is possible that the first electrode 11 is divided more so as to increase electric field effect. However, since one column of second electrodes 21 needs to correspond to one data line 41 (as shown in FIG. 12), it will be difficult for wiring distribution if the second electrode 21 is divided too much.

Optionally, the black electrophoretic particle 31 and the white electrophoretic particle 32 have a same threshold voltage but opposite charges. For example, the black electrophoretic particle 31 can be a negative particle, while the white electrophoretic particle 32 can be a positive particle; alternatively, the black electrophoretic particle 31 can be a positive particle, while the white electrophoretic particle 32 can be a negative particle. Both of the above cases belong to the protection scope of the present disclosure.

The absolute value of the threshold voltage of the black electrophoretic particle 31 is greater than the absolute value of the threshold voltage of the color electrophoretic particle 30. For example, take the green electrophoretic particle and the red electrophoretic particle as example, the green electrophoretic particle and the red electrophoretic particle have a same charge, while the threshold voltage of the green electrophoretic particle is lower than the threshold voltage of the black electrophoretic particle. When a voltage applied between the first electrode 11 and the second electrode 21 is higher than the threshold voltage of the green electrophoretic particle but lower than the threshold voltage of the black electrophoretic particle, the green electrophoretic particle will move while the black electrophoretic particle will not move. The red electrophoretic particle and the white electrophoretic particle have a same charge, while the threshold voltage of the red electrophoretic particle is lower than the threshold voltage of the white electrophoretic particle. When a voltage applied between the first electrode 11 and the second electrode 21 is higher than the threshold voltage of the white electrophoretic particle, both the white electrophoretic particle and the red electrophoretic particle will move.

The electrode configuration of the first electrode in embodiments of the present disclosure will be more clearly described with reference to FIGS. 5-7. FIG. 5 illustrates a schematic diagram of a first electrode of an electronic paper display panel according to an embodiment of the present disclosure. As shown in FIG. 5, the first electrode 11 includes a first sub-electrode 111 and a second sub-electrode 112. Both the first sub-electrode 111 and the second sub-electrode 112 are strip-like electrodes. The first sub-electrode 111 and the second sub-electrode 112 are successively distributed along a first direction X, and extend along a second direction Y. The first sub-electrode 111 and the second sub-electrode 112 are identical electrodes having a same size and shape, or the first sub-electrode 111 and the second sub-electrode 112 are different electrodes having different sizes and shapes, which is not limited herein. Take the first sub-electrode 111 being identical to the second sub-electrode 112 as example, the beneficial effects of such a setting are simpler process design, faster layout design and faster mask design.

Figure 6:
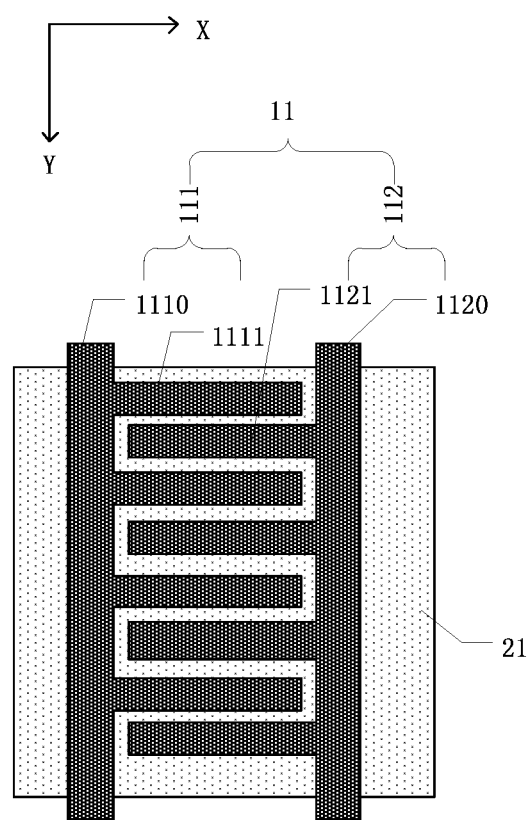
FIG. 6 illustrates a schematic diagram of a first electrode of an electronic paper display panel according to another embodiment of the present disclosure.

Optionally, the first electrode 11 may be a comb-tooth shaped electrode, as shown in FIG. 6, which illustrates a schematic diagram of a first electrode of an electronic paper display panel according to another embodiment of the present disclosure. The first electrode 11 includes a first sub-electrode 111 and a second sub-electrode 112, distribution direction and extending direction of which are the same as that shown in FIG. 5. The first sub-electrode 111 includes a first main electrode 1110 extending along a second direction Y and a plurality of first comb-tooth electrodes 1111 extending along a first direction X. The plurality of first comb-tooth electrodes are successively distributed along the second direction Y and electrically connected with the first main electrode 1110; in a similar way, the second sub-electrode 112 includes a second main electrode 1120 extending along the second direction Y and a plurality of second comb-tooth electrodes 1121 extending along the first direction X. The plurality of second comb-tooth electrodes 1121 are successively distributed along the second direction Y and electrically connected with the second main electrode 1120. In a same pixel area, the first comb-tooth electrodes 1111 and the second comb-tooth electrodes 1121 are alternatively distributed along the second direction Y, that is, the distribution is in an order of "one first comb-tooth electrode 1111-one second comb-tooth electrode 1121-one first comb-tooth electrode 1111- . . . ", and from a structure view, the first sub-electrodes 111 and the second sub-electrodes 112 are engaged with each other. By setting the first electrodes to be in comb-tooth shape, movement of the electrophoretic particles can be promoted, thereby fully utilizing the electrophoretic particles in the area.

Figure 7:
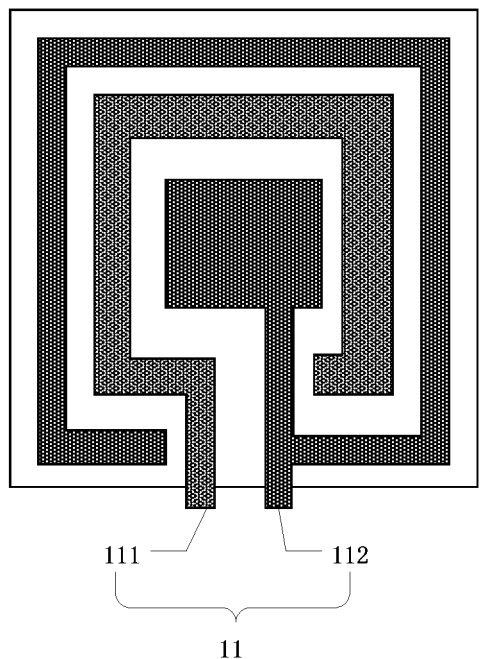
FIG. 7 illustrates a schematic diagram of a first electrode of an electronic paper display panel according to still another embodiment of the present disclosure.

Optionally, the first electrode 11 may also be a "回"-shaped electrode having an opening at one edge, as shown in FIG. 7, which illustrates a schematic diagram of a first electrode of an electronic paper display panel according to still another embodiment of the present disclosure. The first electrode 11 includes a first sub-electrode 111 and a second sub-electrode 112, the first sub-electrode 111 is a "回"-shaped sub-electrode having an opening at one edge, and with reference to accompanying drawings, the first sub-electrode is quadrilateral, and an opening is defined at one edge thereof; the second sub-electrode 112 is similar to the first sub-electrode 111, while the second sub-electrode 112 and the first sub-electrode 111 can have a same shape or different shapes. As shown in FIG. 7, one end of the opening of the "回"-shaped second sub-electrode 112 extends toward the hollow portion of the "回" shape and forms a bloke-like electrode therein, so that a corresponding area of the second sub-electrode 112 can be increased. Such a setting can effectively utilize the area of the pixel area and promote the movement of the electrophoretic particles. Optionally, the opening direction of the first sub-electrode 111 is the same as the opening direction of the second sub-electrode 112, that is, the first sub-electrode 111 and the second sub-electrode 112 open toward the same direction.

Figure 8:
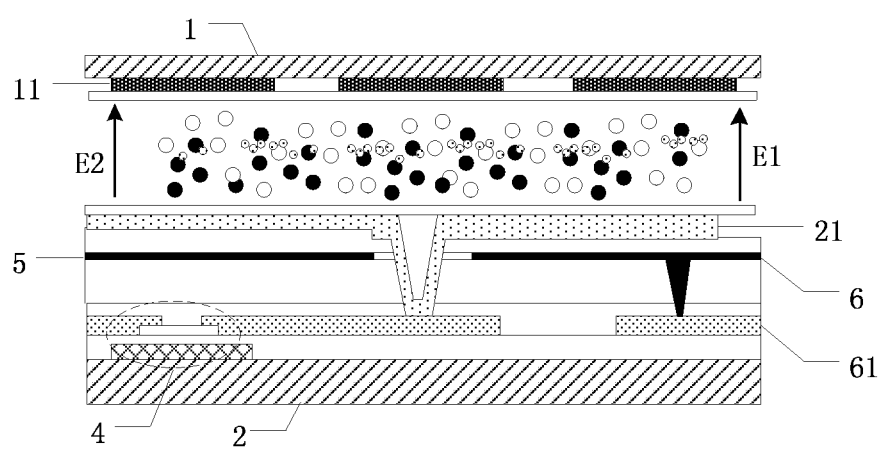
FIG. 8 illustrates a structural schematic diagram of another electronic paper display panel according to an embodiment of the present disclosure.
Figure 9:
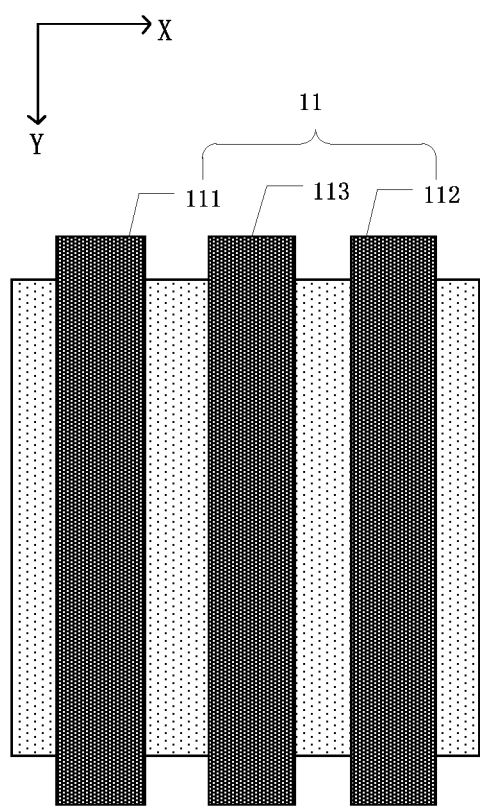
FIG. 9 illustrates a schematic diagram of a first electrode of an electronic paper display panel according to an embodiment of the present disclosure.

In addition to the above-described embodiments, the first electrode 11 may further include a third sub-electrode, a fourth sub-electrode and the like, all division manners of the first electrode 11 shall fall into the protection scope of the present disclosure, which will not be repeated herein. Take the first electrode 11 including the third sub-electrode as example, as shown in FIGS. 8-9, FIG. 8 illustrates a structural schematic diagram of another electronic paper display panel according to an embodiment of the present disclosure; and FIG. 9 illustrates a schematic diagram of a first electrode of an electronic paper display panel according to an embodiment of the present disclosure.

Optionally, the first electrode 11 includes a first sub-electrode 111, a second sub-electrode 112 and a third sub-electrode 113. The first sub-electrode 111 is located at one side of the third sub-electrode 113, and the second sub-electrode 112 is located at the other side of the third sub-electrode 113. All of the first sub-electrode 111, the second sub-electrode 112 and the third sub-electrode 113 are strip-like, the first sub-electrode 111, the second sub-electrode 112 and the third sub-electrode 113 are distributed successively along a first direction X and extend along a second direction Y, and the distribution manner of the three sub-electrodes is similar to the distribution manner of the two sub-electrodes as shown in FIG. 5. Similarly, the first sub-electrode 111, the second sub-electrode 112 and the third sub-electrode 113 may have a same size and shape for facilitating process design; or, the first sub-electrode 111, the second sub-electrode 112 and the third sub-electrode 113 may have different sizes and shapes, which can be adjusted according to the size of the panel.

Figure 10:
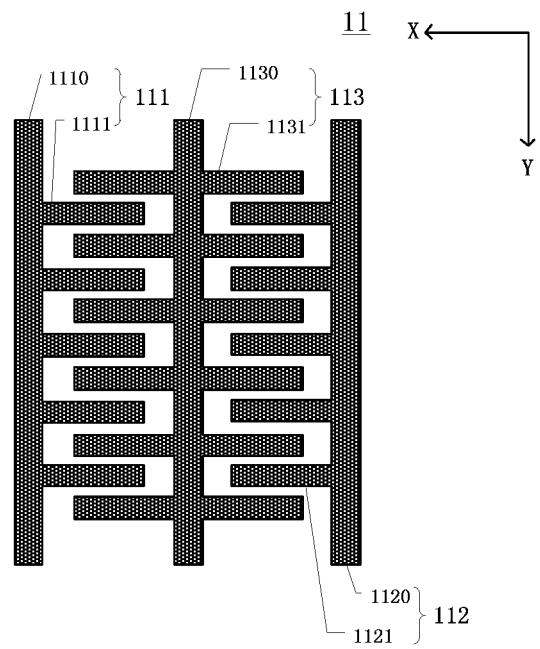
FIG. 10 illustrates a schematic diagram of a first electrode of an electronic paper display panel according to another embodiment of the present disclosure.

Optionally, the first electrode 11 is a comb-tooth electrode, as shown in FIG. 10, which illustrates a schematic diagram of a first electrode of an electronic paper display panel according to another embodiment of the present disclosure. The first sub-electrode 111 includes a first main electrode 1110 and a plurality of first comb-tooth electrodes 1111, the first comb-tooth electrodes 1111 electrically connected with the first main electrode 1110 and extending at a side of first main electrode 1110 facing the second sub-electrode 112 along a first direction X; the second sub-electrode 112 includes a second main electrode 1120 and a plurality of second comb-tooth electrodes 1121, the second comb-tooth electrodes 1121 electrically connected with the second main electrode 1120 and extending at side of the second main electrode 1120 facing the first sub-electrode 111 along the first direction X; the extending direction of the first comb-tooth electrodes 1111 is opposite to the extending direction of the second comb-tooth electrodes 1121; the third sub-electrode 113 is located between the first sub-electrode 111 and the second sub-electrode 112, the third sub-electrode 113 includes a third main electrode 1130 and a plurality of third comb-tooth electrode 1131, the third comb-tooth electrodes 1131 electrically connected with the third main electrode 1130 and extending at two sides of the third main electrode 1130 along the first direction X. As shown in FIG. 10, the third comb-tooth electrodes 1131 are respectively arranged at two sides of the third main electrode 1130 and extend respectively along the first direction X. As shown in FIG. 10, the third comb-tooth electrodes 1131 are successively distributed at two sides of the third main electrode 1130 in a symmetrical manner; or, the third main electrode 1130 can be successively distributed at two sides of the third main electrode 1130 in an alternative manner; the present disclosure has no limitation thereon, and any distribution manner shall fall into the protection scope of present disclosure. As for the structural configuration, the first comb-tooth electrodes 1111 of the first sub-electrode 111 and the third comb-tooth electrodes 1131 of the third sub-electrode 113 are alternatively distributed along a second direction Y, and the second comb-tooth electrodes 1121 of the second sub-electrode 112 and the third comb-tooth electrodes 1131 of the third sub-electrode 113 are alternatively distributed along the second direction Y. The first sub-electrode 111, the second sub-electrode 112 and the third sub-electrode 113 are engaged with each other. By configuring that the first electrode has a comb-tooth shape, movement of the electrophoretic particle can be promoted, thereby fully utilizing the electrophoretic particles in the area.

Figure 11:
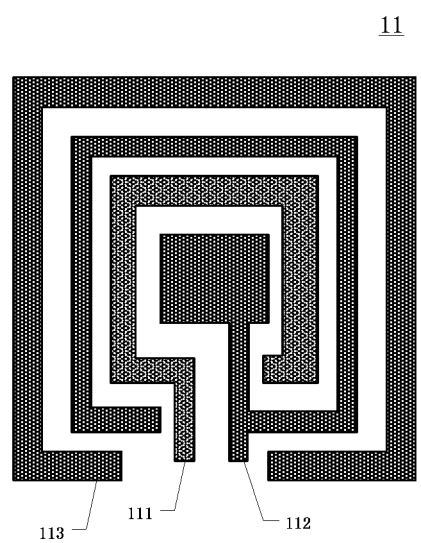
FIG. 11 illustrates a schematic diagram of a first electrode of an electronic paper display panel according to still another embodiment of the present disclosure.

Optionally, the third sub-electrode 113 of the first electrode 11 may also be shaped as "回", as shown in FIG. 11, which illustrates a schematic diagram of a first electrode of an electronic paper display panel according to still another embodiment of the present disclosure. The first electrode 11 includes a first sub-electrode 111, a second sub-electrode 112 and a third sub-electrode 113, specific shapes of the first sub-electrode 111 and the second sub-electrode 112 can refer to FIG. 7 and corresponding descriptions, which will not be repeated herein. As shown in FIG. 11, the third sub-electrode 113 is a "回"-shaped sub-electrode having an opening at one edge, the third sub-electrode 113 is located at periphery of the first sub-electrode 111 and the second sub-electrode 112, besides, the first sub-electrode 111, the second sub-electrode 112 and the third sub-electrode 113 have a same opening direction in one plane. With the third sub-electrode 113 added, a voltage different from the voltage on the first sub-electrode 111 and the voltage on the second sub-electrode 112 is input to the third sub-electrode 113, so that one pixel area has three different voltages, and thus at least three kinds of electrophoretic particles in the same area can move with respect to each other, thereby facilitating color display.

Optionally, FIG. 12 illustrates a schematic diagram of a second electrode of an electronic paper display panel according to an embodiment of the present disclosure. As shown in FIG. 12, the electronic paper display panel includes a display area and a non-display area. Take the second substrate 2 shown in figures as example, the display area is defined as AA, and the non-display area is defined as AA', and the non-display area AA' surrounds the display area AA. The display area AA includes a plurality of pixel areas P, and each pixel area P includes one second electrode 21. The second electrodes 21 are distributed in an array in the display area AA. As shown in FIG. 12, the second electrodes 21 are distributed in a 6*6 array in the display area AA, that is, the whole display area AA includes six rows and six columns of second electrodes 21. A regular distribution of the second electrodes 21 (i.e., pixel electrodes) can help to simplify the process design and meanwhile reasonably utilize the whole display area AA of the electronic paper display panel. In addition, FIG. 12 further schematically illustrates a gate line 40 and a data line 41 of the electronic paper display panel. When the gate line 40 receives a signal, a corresponding thin film transistor switch is turned on, at this time, a corresponding data line 41 transmits a data signal to the second electrode 21 (i.e., pixel electrode) through the thin film transistor, so as to obtain voltage signal.

In addition, as shown in FIGS. 4 and 8, a thin film transistor switch 4 is further provided at a side of the second substrate 2 facing the first substrate 1, the thin film transistor 4 consists of a gate electrode, an active layer, a first electrode, and a second electrode. The first electrode is one of a source electrode and a drain electrode, while the second electrode is the other one of the source electrode and the drain electrode. The second electrode 21 is electrically connected with one electrode of the thin film transistor 4 through a through hole. The embodiment of the present disclosure merely exemplify the case in which the second electrode 21 is electrically connected with the thin film transistor 4 through the through hole, in other embodiments, the second electrode may be electrically connected with the thin film transistor by directly contacting with the thin film transistor or by means of conductive particle, which will not be repeated and limited herein.

Figure 13:
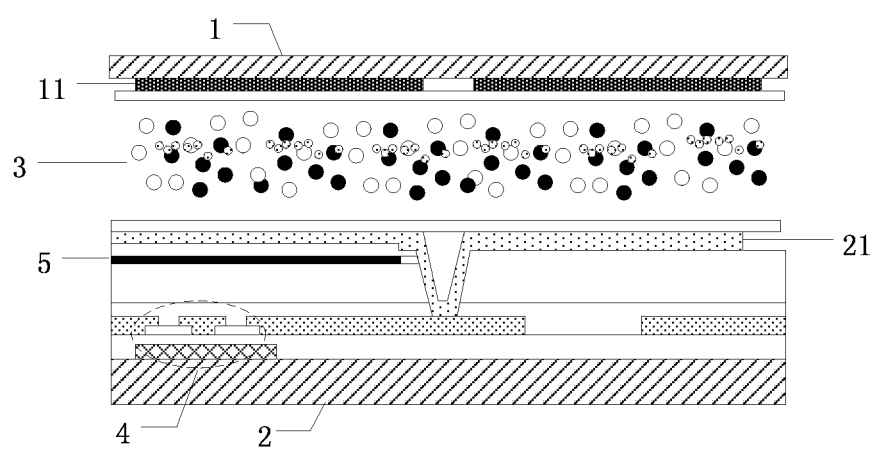
FIG. 13 illustrates a structural schematic diagram of still another electronic paper display panel according to an embodiment of the present disclosure.

FIG. 13 illustrates a structural schematic diagram of an electronic paper display device according to an embodiment of the present disclosure. As shown in FIG. 13, the thin film transistor 4 at a side of the second substrate 2 is a dual-channel thin film transistor, that is, the thin film transistor includes two active layer areas. Compared with a single-channel thin film transistor, the dual-channel thin film transistor has characteristics of small leakage current and small fluctuation. The dual-channel thin film transistor in the embodiments of the present disclosure is also adaptive to any embodiment in FIGS. 4-12.

As shown in FIGS. 4, 8 and 13, a first metal layer 5 is provided at a side of the second substrate 2 of the electronic paper display panel close to the first substrate 1, and the first metal layer 5 is located between the second electrode 21 and the thin film transistor 4. The first metal layer 5 covers the thin film transistor switch 4, or at least covers the active layer area of the thin film transistor 4. Since the electronic paper achieves image display via external light, and the thin film transistor 4 element is relatively sensitive to light and thus the influence of the light on the active area is relatively great when the external light enters the panel and reach the second substrate 2, the first metal layer 5 needs to be provided to prevent the external light from getting into a thin film transistor 4. The first metal layer 5 should cover at least the active area of the thin film transistor 4 in size.

Optionally, the electronic paper display panel of the present disclosure further includes a touch structure. As shown in FIGS. 4 and 8, a touch electrode 6 is arranged on the second substrate 2. The touch electrode 6 may be a self-capacitance touch electrode, and the touch electrodes 6 are distributed in an array like the distribution of second electrodes 21 as shown in FIG. 12, for example, the touch electrodes 6 are distributed in a M*N array, wherein both M and N are positive integers greater than or equal to 2. The principle of the self-capacitance touch is: a capacitance is formed by the touch electrode 6 and a finger, and the touch position is detected by sensing the capacitance change. The touch electrode 6 is electrically connected with the drive circuit (not shown in figures) via a touch wiring 61 so as to receive touch signal transmitted by the drive circuit. The touch electrode 6 is electrically connected with the touch wiring 61 through a through hole. The touch electrode 6 and the first metal layer 5 may be arranged in a same layer, the touch wiring 61 and the first electrode (or the second electrode) of the thin film transistor 4 are arranged in a same layer. Such an arrangement can effectively utilize hierarchical configuration in the second substrate 2, thereby reducing thickness of the film layer, which is beneficial to thinning of the electronic paper display panel. Obviously, the present disclosure is not limited herein, the touch electrode 6 and the second electrode 21 may be arranged in a same layer or the touch electrode 6 may utilize any film layer in the second substrate 2; the touch wiring 61 and the gate electrode of the thin film transistor 4 may be arranged in a same layer or the touch wiring 61 may utilize any film layer in the second substrate 2.

In order to cater for the characteristics of thinning and flexibility of the display panel in the market, the first substrate 1 of the electronic paper display panel provided by the embodiments of the present disclosure may be made of polymer. Organic polymer, such as polyimide and the like, has characteristics of easy buckling and being bendable, which facilitates flexible bending of the electronic paper display panel. The first substrate 1 can also be made of glass material, which will not be repeated herein, and the material of the first substrate 1 can be adjusted according to the actual needs.

The present disclosure further provides a driving method for driving the electronic paper display panel in any of the above embodiments, and the driving method mainly includes a reset stage and a display stage. FIGS. 14a-14e illustrate a schematic diagram of a driving method of an electronic paper display panel according to an embodiment of the present disclosure.

Figure 14A:
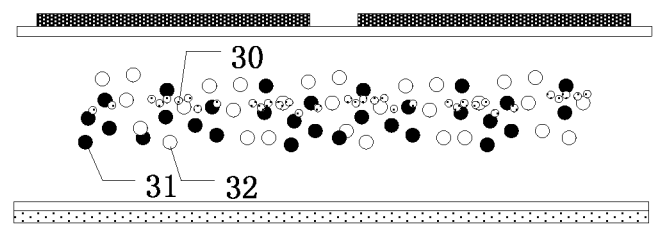
FIGS. 14a-14e illustrate a schematic diagram of a driving method of an electronic paper display panel according to an embodiment of the present disclosure.

FIG. 14a illustrates a reset stage of an electronic paper display panel. During the reset stage, the black electrophoretic particle 31, the white electrophoretic particle 32 and the color electrophoretic particle 30 are in a suspension state, and in such a state, since there is no corresponding voltage applied, the electrophoretic particles are in a relatively stationary state.

FIGS. 14b-14e illustrate a display stage of an electronic paper display panel. By inputting a drive signal V0 to the second electrode, inputting a first signal V1 to the first sub-electrode, and inputting a second signal V2 to the second sub-electrode, electric field can be obtained, so as to drive the electrophoretic particle to move.

For example, the black electrophoretic particle 31 is negative particle, the white electrophoretic particle 32 is positive particle, and the color electrophoretic particle 30 is negative particle. The black electrophoretic particle 31 and the white electrophoretic particle 32 have a same absolute value of threshold voltage but opposite charges, meanwhile the absolute value of threshold voltage of the black electrophoretic particle 31 is greater than the absolute value of threshold voltage of the color electrophoretic particle 30.

Figure 14B:
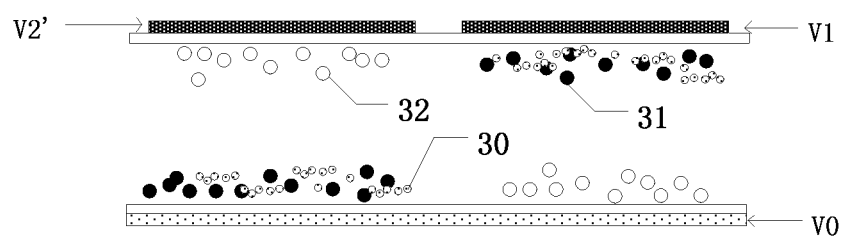

As shown in FIG. 14b, the drive signal V0 is input to the second electrode, the first signal V1 is input to the first sub-electrode, a second sub-signal V2' is input to the second sub-electrode, the absolute value of the voltage difference between the first signal V1 and the drive signal V0 is greater than or equal to the absolute value of the threshold voltage of the black electrophoretic particle 31, at this time, both the black electrophoretic particle 31 and the color electrophoretic particle 30 swim toward the first sub-electrode, and the white electrophoretic particle 32 swims toward the second electrode. The absolute value of the voltage difference between the second sub-signal V2' and the drive signal V0 is greater than or equal to the absolute value of the threshold voltage of the white electrophoretic particle 32, at this time, the white electrophoretic particle 32 moves toward the second sub-electrode, and both the black electrophoretic particle 31 and the color electrophoretic particle 30 move toward the second electrode. In this process, one pixel area may partially display white image and partially display a mixture color image of black and color.

Figure 14C:
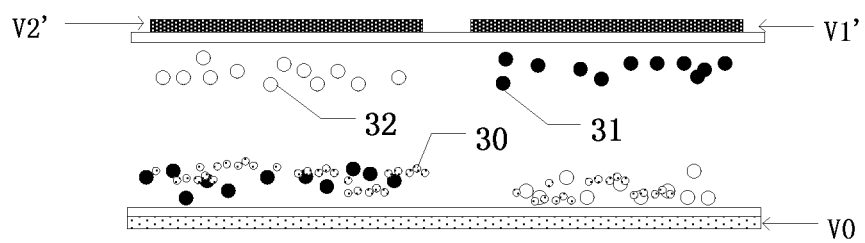

As shown in FIG. 14c, the voltage signal on the first sub-electrode is changed to be a first sub-signal V1' on the basis of FIG. 14b, at this time, the absolute value of the voltage difference between the driving signal V0 and the first sub-signal V1' is exactly reaches the absolute value of the threshold voltage of the color electrophoretic particle 30, but does not reach the threshold voltages of the black electrophoretic particle 31 and the white electrophoretic particle 32, so that the black electrophoretic particle 31 and the white electrophoretic particle 32 do not move while the color electrophoretic particle 30 moves toward the second electrode under the action of opposite electric field force, that is, the color electrophoretic particle 30 is drawn to the second electrode side.

Figure 14D:
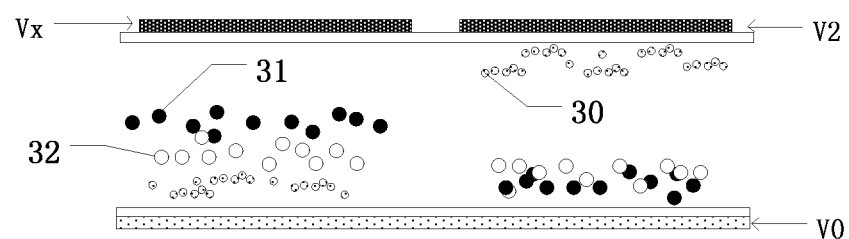

As shown in FIG. 14d, the second signal V2 is input to the second sub-electrode. The absolute value of the voltage difference between the second signal V2 and the drive signal V0 is greater than or equal to the absolute value of the threshold voltage of the color electrophoretic particle 30 but smaller than the absolute value of the threshold voltage of the black electrophoretic particle 31, at this time, both the black electrophoretic particle 31 and the white electrophoretic particle 32 do not move, while the color electrophoretic particle 30 moves toward the second sub-electrode under the action of electric field. In one pixel area, a gray-signal Vx is input to the first sub-electrode, and the absolute value of the voltage difference between the gray-scale signal Vx and the drive signal V0 is smaller than the threshold voltage of the color electrophoretic particle. At this time, to a certain extent, the black electrophoretic particle 31, the white electrophoretic particle 32 and the color electrophoretic particle 30 move to different positions between the first electrode and the second electrode, thereby achieving mixture of different brightness, and thus presenting different gray-scales.

Figure 14E:
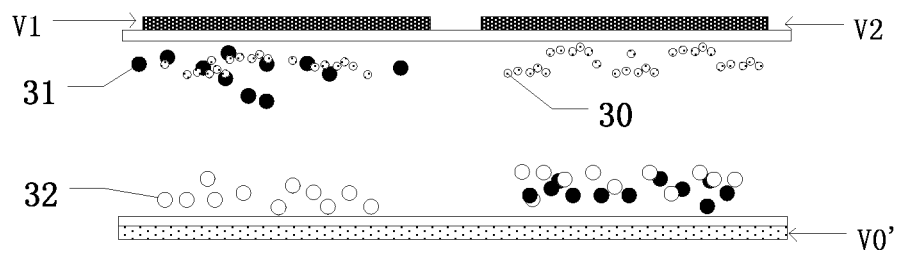

As shown in FIG. 14e, the first signal V1 in input to the first sub-electrode, and the second signal V2 is input to the second sub-electrode. The absolute value of the voltage difference between the first signal V1 and the drive signal V0 is greater than or equal to the absolute value of the threshold voltage of the black electrophoretic particle 31, at this time, both the black electrophoretic particle 31 and the color electrophoretic particle 30 move toward the first sub-electrode, and the white electrophoretic particle 32 moves toward the second electrode; the absolute value of the voltage difference between the second signal V2 and the drive signal V0 is greater than or equal to the threshold voltage of the color electrophoretic particle 30 but less than the absolute value of the threshold voltage of the black electrophoretic particle 31, at this time, only the color electrophoretic particle 30 moves toward the second sub-electrode.

Color display can be achieved by means of the above method, in a same pixel area, different voltage signals are respectively input to different first electrodes so as to drive different electrophoretic particles to move, thereby enriching the gray-scale and color within the same area.

The present embodiment merely takes the first sub-electrode and the second sub-electrode as example, however, a third sub-electrode can also be included, a third signal is input to the third sub-electrode, and the color electrophoretic particle includes a first color electrophoretic particle and a second color electrophoretic particle, for example, red electrophoretic particle and green electrophoretic particle. In this case, the absolute value of the voltage difference between the first signal and the drive signal is greater than the absolute value of the voltage difference between the second signal and the drive signal; the absolute value of the voltage difference between the first signal and the drive signal is greater than the absolute value of the voltage difference between the third signal and the drive signal; the absolute value of the voltage difference between the second signal and the drive signal is greater than the absolute value of the voltage difference between the third signal and the drive signal. The absolute value of the voltage difference between the first signal and the drive signal is greater than or equal to the absolute value of the threshold voltage of the black electrophoretic particle, which drives the black electrophoretic particle to move; the absolute value of the voltage difference between the second signal and the drive signal is greater than or equal to the absolute value of the threshold voltage of the first color electrophoretic particle but smaller than the absolute value of the threshold voltage of the black electrophoretic particle, which drives the first color electrophoretic particle to move; the absolute value of the voltage difference between the third signal and the drive signal is greater than or equal to the absolute value of the threshold voltage of the second color electrophoretic particle but smaller than the absolute value of the threshold voltage of the first color electrophoretic particle, which drives the second color electrophoretic particle to move. The specific driving principle is the same as shown in FIGS. 14a-14e, which will not be repeated herein.

Figure 15:
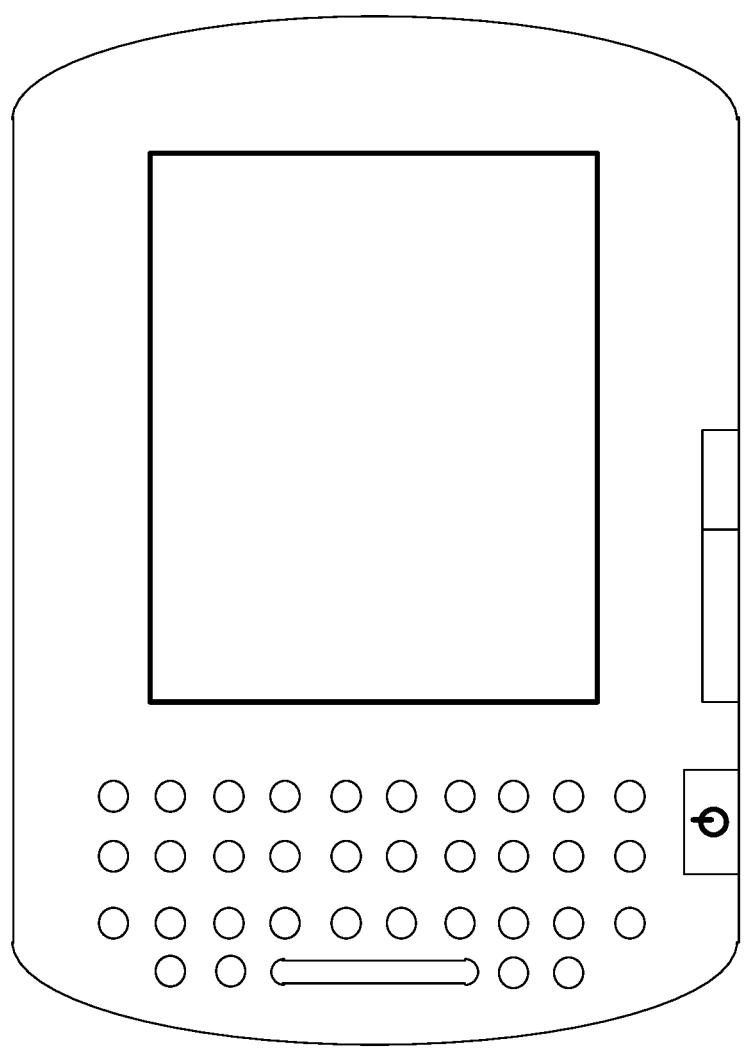
FIG. 15 illustrates a structural schematic diagram of an electronic paper display device according to an embodiment of the present disclosure.

The present disclosure further provides an electronic paper display device, including the electronic paper display panel as described in any above embodiment, as shown in FIG. 15, which illustrates a structural schematic diagram of an electronic paper display device according to an embodiment of the present disclosure. The device has the electronic paper display panel and the corresponding components, switches, buttons, etc., which can achieve color display.

It should be noted that, the above description is merely preferred embodiments of the present disclosure and the technical principles used herein. It will be understood by those skilled in the art that the present disclosure is not limited to the embodiments described herein, and that various changes, modifications and substitutions can be made by those skilled in the art without departing from the scope of the present disclosure. Thus, even though the present disclosure has been described in detail by the above embodiments, the present disclosure is not limited to the above embodiments, more equivalent embodiments can be provided without departing from the present disclosure concept, and the protection scope of the present disclosure is determined by the scope of the appended claims.

What is claimed is:

1. An electronic paper display panel, comprising:
a first substrate;
a second substrate opposite to the first substrate;
an electrophoresis layer arranged between the first substrate and the second substrate; the electrophoresis layer comprising a black electrophoretic particle, a white electrophoretic particle and at least one color electrophoretic particle;
a first electrode layer arranged at a side of the first substrate facing the second substrate, the first electrode layer comprising a plurality of first electrodes;
a second electrode layer arranged at a side of the second substrate facing the first substrate, the second electrode layer comprising a plurality of second electrodes; and
a drive circuit;
wherein the electronic paper display panel has a plurality of pixel areas, and in each pixel area, one first electrode of the plurality of first electrodes and one second electrode of the a plurality of second electrodes are arranged; each first electrode comprises a first sub-electrode and a second sub-electrode, and the first sub-electrode is electrically insulated from the second sub-electrode; and the first sub-electrode and the second sub-electrode of the first electrode correspond to the second electrode in a same pixel area;
the first sub-electrode and the second sub-electrode are electrically connected with the drive circuit, the first sub-electrode receives a voltage signal different from a voltage signal the second sub-electrode receives;
the plurality of first electrodes is common electrodes and the plurality of second electrodes is pixel electrodes;
a threshold voltage of the black electrophoretic particle is equal to a threshold voltage of the white electrophoretic particle, the black electrophoretic particle and the white electrophoretic particle have opposite charges; and
an absolute value of the threshold voltage of the black electrophoretic particle is greater than an absolute value of a threshold voltage of the color electrophoretic particle.

2. The electronic paper display panel according to claim 1, wherein the color electrophoretic particle is at least one of red electrophoretic particle, green electrophoretic particle and yellow electrophoretic particle.

3. The electronic paper display panel according to claim 1, wherein the first sub-electrode and the second sub-electrode are strip-like sub-electrodes, and the first sub-electrode and the second sub-electrode are successively distributed along a first direction and extend along a second direction.

4. The electronic paper display panel according to claim 1, wherein the first sub-electrode comprises a first main electrode and a plurality of first comb-teethelectrodes, the first main electrode extends along a second direction, and the plurality of first comb-tooth electrodes is connected with the first main electrode and extends along a first direction;
the second sub-electrode comprises a second main electrode and a plurality of second comb-tooth electrodes, the second main electrode extends along the second direction, and the plurality of second comb-tooth electrodes is connected with the second main electrode and extends along the first direction; and
the plurality of first comb-tooth electrodes and the plurality of second comb-tooth electrodes are alternatively distributed along the second direction, and the first sub-electrode is engaged with the second sub-electrode.

5. The electronic paper display panel according to claim 1, wherein the first sub-electrode is shaped as "" having an opening at one edge thereof, the second sub-electrode is shaped as "" having an opening at one edge thereof, and an opening direction of the first sub-electrode is the same as an opening direction of the second sub-electrode within a same plane.

6. The electronic paper display panel according to claim 1, wherein each of the plurality of first electrodes further comprises a third sub-electrode.

7. The electronic paper display panel according to claim 6, wherein the first sub-electrode, the second sub-electrode and the third sub-electrode are strip-like sub-electrodes, and the first sub-electrode, the second sub-electrode and the third sub-electrode are successively distributed along a first direction and extend along a second direction.

8. The electronic paper display panel according to claim 6, wherein the first sub-electrode comprises a first main electrode and a plurality of first comb-tooth electrodes, and the plurality of first comb-tooth electrodes is connected with the first main electrode and extends along a first direction;
the second sub-electrode comprises a second main electrode and a plurality of second comb-tooth electrodes, and the plurality of second comb-tooth electrodes is electrically connected with the second main electrode and extends along the first direction;
the third sub-electrode comprises a third main electrode and a plurality of third comb-tooth electrodes, and the plurality of third comb-tooth electrodes is electrically connected with the third main electrode and extends along the first direction;
the third sub-electrode is located between the first sub-electrode and the second sub-electrode; and
the first comb-tooth electrodes and the third comb-tooth electrodes are alternatively distributed along a second direction, the second comb-tooth electrodes and the third comb-tooth electrodes are alternatively distributed along the second direction, the first sub-electrode is engaged with the third sub-electrode, and the second sub-electrode is engaged with the third sub-electrode.

9. The electronic paper display panel according to claim 6, wherein the first sub-electrode is shaped as "" having an opening at one edge thereof, the second sub-electrode is shaped as "" having an opening at one edge thereof, the third sub-electrode is shaped as "" having an opening at one edge thereof, and an opening direction of the first sub-electrode, an opening direction of the second sub-electrode, and an opening direction of the third sub-electrode are identical within a same plane.

10. The electronic paper display panel according to claim 1, wherein the electronic paper display panel has a display area and a non-display area, and the second electrodes are distributed in an array in the display area.

11. The electronic paper display panel according to claim 1, further comprising a thin film transistor switch placed on the second substrate, wherein the second electrodes are electrically connected with an electrode of the thin film transistor switch.

12. The electronic paper display panel according to claim 11, wherein the thin film transistor switch is a dual-channel thin film transistor switch.

13. The electronic paper display panel according to claim 11, further comprising a first metal layer, wherein the first metal layer is located between the second electrodes and the thin film transistor switch, and the first metal layer covers the thin film transistor switch.

14. The electronic paper display panel according to claim 13, further comprising a touch electrode and a touch wiring electrically connected with the touch electrode, wherein the touch electrode and the first metal layer are arranged in a same layer.

15. The electronic paper display panel according to claim 1, wherein the first substrate is made of polymer or glass.

16. A driving method for driving an electronic paper display panel, wherein the electronic paper display panel comprises:
    a first substrate;
    a second substrate opposite to the first substrate;
    an electrophoresis layer arranged between the first substrate and the second substrate; the electrophoresis layer comprising a black electrophoretic particle, a white electrophoretic particle and at least one color electrophoretic particle;
    a first electrode layer arranged at a side of the first substrate facing the second substrate, the first electrode layer comprising a plurality of first electrodes;
    a second electrode layer arranged at a side of the second substrate facing the first substrate, the second electrode layer comprising a plurality of second electrodes; and
    a drive circuit;
    wherein the electronic paper display panel has a plurality of pixel areas, and in each pixel area, one first electrode of the plurality of first electrodes and one second electrode of the a plurality of second electrodes are arranged; each first electrode comprises a first sub-electrode and a second sub-electrode, and the first sub-electrode is electrically insulated from the second sub-electrode; and the first sub-electrode and the second sub-electrode of the first electrode correspond to the second electrode in a same pixel area;
    the first sub-electrode and the second sub-electrode are electrically connected with the drive circuit, the first sub-electrode receives a voltage signal different from a voltage signal the second sub-electrode receives;
    the plurality of first electrodes is common electrodes and the plurality of second electrodes is pixel electrodes;
    a threshold voltage of the black electrophoretic particle is equal to a threshold voltage of the white electrophoretic particle, the black electrophoretic particle and the white electrophoretic particle have opposite charges; and
    an absolute value of the threshold voltage of the black electrophoretic particle is greater than an absolute value of a threshold voltage of the color electrophoretic particle;
    wherein the driving method comprises a reset stage and a display stage,
    during the reset stage, the black electrophoretic particle, the white electrophoretic particle and the color electrophoretic particle are in a suspension state; and
    during the display stage, inputting a drive signal to the second electrodes, inputting a first signal to the first sub-electrodes, and inputting a second signal to the second sub-electrodes.

17. The driving method according to claim 16, wherein an absolute value of the first signal is greater than an absolute value of the second signal;
    an absolute value of a voltage difference between the first signal and the drive signal is greater than or equal to an absolute value of a threshold voltage of the black electrophoretic particle; and
    an absolute value of a voltage difference between the second signal and the drive signal is greater than or equal to a threshold voltage of the color electrophoretic particle but smaller than the absolute value of the threshold voltage of the black electrophoretic particle.

18. The driving method according to claim 16, wherein the color electrophoretic particle comprises a first color electrophoretic particle and a second color electrophoretic particle; and
    a threshold voltage of the first color electrophoretic particle is greater than a threshold voltage of the second color electrophoretic particle.

19. The driving method according to claim 18, wherein each of the first electrodes further comprises a third sub-electrode,
    during the display stage, inputting a third signal to the third sub-electrode;
    an absolute value of a voltage difference between the first signal and the drive signal is greater than an absolute value of a voltage difference between the second signal and the drive signal;
    the absolute value of the voltage difference between the first signal and the drive signal is greater than an absolute value of a voltage difference between the third signal and the drive signal;
    the absolute value of the voltage difference between the second signal and the drive signal is greater the absolute value of the voltage difference between the third signal and the drive signal;
    the absolute value of the voltage difference between the first signal and the drive signal is greater than or equal to an absolute value of a threshold voltage of the black electrophoretic particle;
    the absolute value of the voltage difference between the second signal and the drive signal is greater than or equal to an absolute value of the threshold voltage of the first color electrophoretic particle but smaller than the absolute value of the threshold voltage of the black electrophoretic particle; and
    the absolute value of the voltage difference between the third signal and the drive signal is greater than or equal to an absolute value of the threshold voltage of the second color electrophoretic particle but smaller than the absolute value of the threshold voltage of the first color electrophoretic particle.

20. An electronic paper display device, comprising an electronic paper display panel, and the electronic paper display panel comprises:
- a first substrate;
- a second substrate opposite to the first substrate;
- an electrophoresis layer arranged between the first substrate and the second substrate; the electrophoresis layer comprising a black electrophoretic particle, a white electrophoretic particle and at least one color electrophoretic particle;
- a first electrode layer arranged at a side of the first substrate facing the second substrate, the first electrode layer comprising a plurality of first electrodes;
- a second electrode layer arranged at a side of the second substrate facing the first substrate, the second electrode layer comprising a plurality of second electrodes; and
- a drive circuit;
- wherein the electronic paper display panel has a plurality of pixel areas, and in each pixel area, one first electrode of the plurality of first electrodes and one second electrode of the a plurality of second electrodes are arranged; each first electrode comprises a first sub-electrode and a second sub-electrode, and the first sub-electrode is electrically insulated from the second sub-electrode; the first sub-electrode and the second sub-electrode of the first electrode correspond to the second electrode in a same pixel area;
- the first sub-electrode and the second sub-electrode are electrically connected with the drive circuit, the first sub-electrode receives a voltage signal different from a voltage signal the second sub-electrode receives;
- the plurality of first electrodes is common electrodes and the plurality of second electrodes is pixel electrodes;
- a threshold voltage of the black electrophoretic particle is equal to a threshold voltage of the white electrophoretic particle, the black electrophoretic particle and the white electrophoretic particle have opposite charges; and
- an absolute value of the threshold voltage of the black electrophoretic particle is greater than an absolute value of a threshold voltage of the color electrophoretic particle.

* * * * *